United States Patent [19]

Herbert

[11] Patent Number: 5,023,838

[45] Date of Patent: Jun. 11, 1991

[54] RANDOM ACCESS MEMORY DEVICE WITH INTEGRAL LOGIC CAPABILITY

[75] Inventor: Brian K. Herbert, Colorado Springs, Colo.

[73] Assignee: NCR Corporation, Dayton, Ohio

[21] Appl. No.: 279,606

[22] Filed: Dec. 2, 1988

[51] Int. Cl.$^5$ .................... G11C 7/00; G11C 11/413; G11C 7/06
[52] U.S. Cl. .................... 365/189.08; 365/189.05; 365/207; 307/445
[58] Field of Search .................... 365/189.05, 189.080, 365/221, 239, 230.03, 445, 448, 207, 208; 307/465, 468, 530

[56] References Cited

U.S. PATENT DOCUMENTS

| | | | |
|---|---|---|---|
| 3,787,817 | 1/1974 | Goldberg | 365/219 X |
| 4,016,544 | 4/1977 | Morita et al. | 364/900 |
| 4,445,203 | 4/1984 | Iwahashi | 365/189.08 X |
| 4,524,430 | 6/1985 | Page | 365/189.08 X |
| 4,527,081 | 7/1985 | Stewart | 365/189.08 X |
| 4,586,169 | 4/1986 | Itoh et al. | 365/190 |
| 4,807,189 | 2/1989 | Pinkham et al. | 365/230.03 X |
| 4,814,646 | 3/1989 | Hoberman et al. | 307/465 X |
| 4,825,410 | 8/1989 | Lee | 365/189.08 |

FOREIGN PATENT DOCUMENTS 0189524 10/1984 European Pat. Off. .
0209050 7/1985 European Pat. Off. .

OTHER PUBLICATIONS

*Digital Design*, Apr. 1986; "Video DRAMs Shift Image of Graphics Systems", by Wilson.

*Primary Examiner*—Alyssa H. Bowler
*Attorney, Agent, or Firm*—Wilbert Hawk, Jr.; Stephen F. Jewett; Casimer K. Salys

[57] ABSTRACT

A random access memory (RAM) device capable of performing logic combinations of new and previously stored data in a single memory access cycle. In contrast to conventional RAM data combination sequences, which involve a succession of read-modify-write cycles, the present architecture implements logical combinations of new RAM data with old RAM data during a single access cycle. In a preferred arrangement, decoding logic combines the new data with mode select signals to generate a set of FORCE 1, FORCE 0, COMP and NOOP control signals. The control signals regulate the bit line sense amplifier and logic to allow direct interaction with the bit line data during RAM addressing. The invention is particularly useful in graphic video display systems frame buffers where rapid pattern changes are difficult to implement using moderate speed and cost RAM devices.

3 Claims, 5 Drawing Sheets

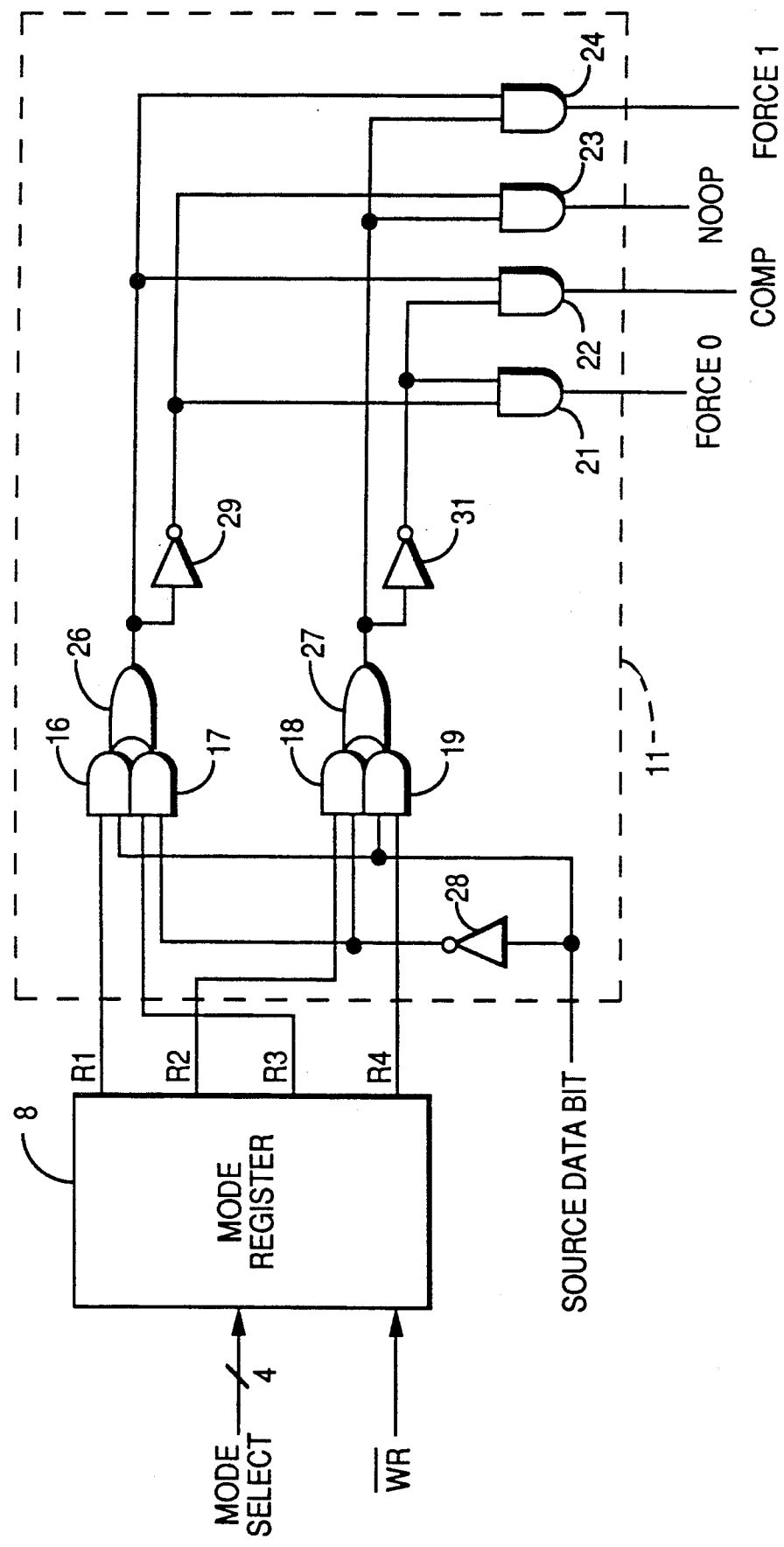

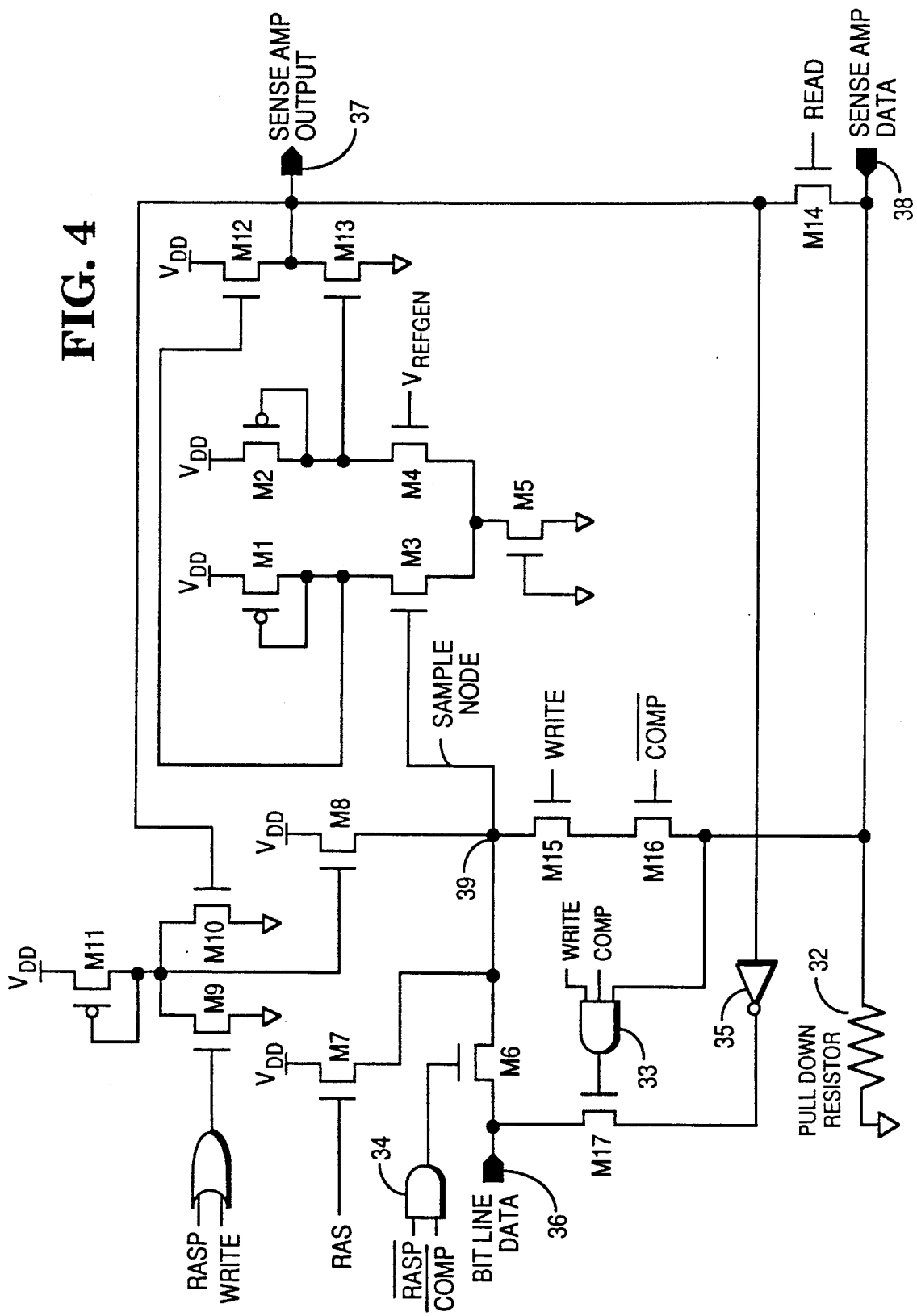

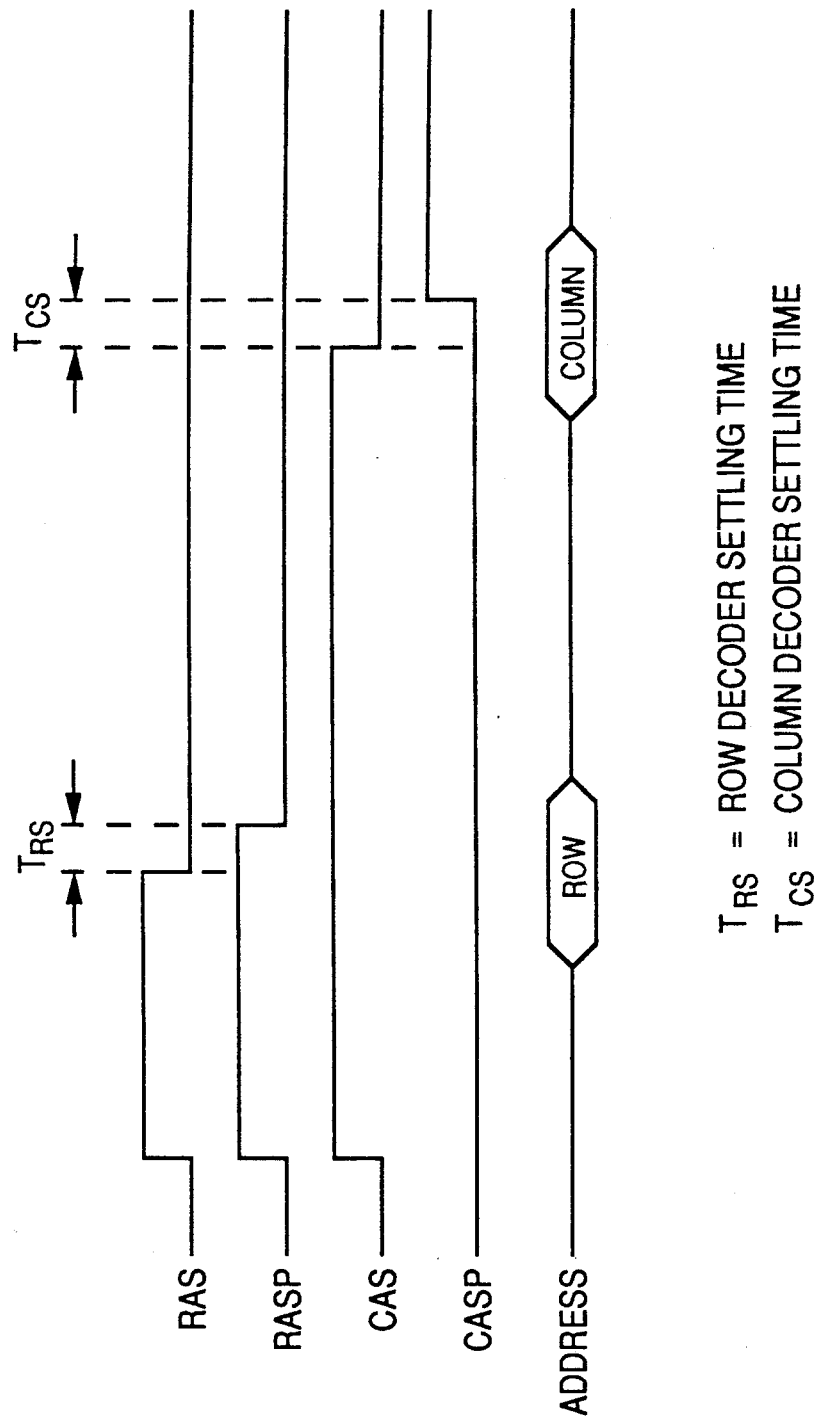

RANDOM ACCESS MEMORY DEVICE WITH INTEGRAL LOGIC CAPABILITY

BACKGROUND OF THE INVENTION

The present invention relates to a special class of integrated circuit dynamic random access memories (DRAMs) More particularly, the invention involves random access memories configured with elements which perform logical operations on the data stored within the RAM during a single access cycle, in contrast to a conventional read-modify-write succession of cycles.

Dynamic random access memories and their applications are well known by those even moderately skilled in digital computer technology. As conventionally used, memory arrays are arranged to store binary data which is written to individual cells by selecting the row and column addresses thereof from within the array. Extraction of previously stored data is completed through a similarly addressed read operation, which operation concurrently refreshes the data in the selected cell. If the data stored in the cell of the memory array is to be logically combined with external data and thereafter again stored within the same cell, the conventional practice has been to execute a read-modify-write sequence of operations. In a conventional clock synchronized system such logical combination routine extends over at least one and one-half memory array access time intervals and thus tends to be one of the slowest of processor operations.

The application of random access memories in frame buffers of the video displays, and the concurrent increase in the pixel count and color variations expected of contemporary video displays, has led to an accentuated need for increasing the rate at which binary data from a dynamic random memory array cell can be logically combined with new data and then returned to the same frame buffer cell address. Therefore, there exists a present need for computer architecture and circuitry which allows logical combinations of memory array cell data with external data within the memory array structure, in contrast to transferring the previously stored memory data to a processor ALU, performing the logical operations, and thereafter returning the resultant data to the same memory cell.

Various teachings in the references relate to this problem. For instance, the U.S. Pat. No. 4,016,544 uses mask initiated writing of bits into memory, but provides no logical combination with previous data in memory. The apparatus in U.S. Pat. No. 3,787,817 uses closely coupled logic to combine previously stored data with new data, but does so in the classic read-modify-write operational sequence. A somewhat more refined use of combinational logic is described in the article entitled "Video DRAMs Shift Image of Graphics Systems" by Wilson, as appeared in the April 1986 issue *Digital Design*. However, again the combinational logic is drawn into use in the context of a conventional read-modify-write sequence of memory operation. Integration of logic and memory array functions is disclosed in U.S. Pat. No. 4,586,169. In this case, however, each memory cell in the array is arranged to include logic capability. Unfortunately, the latter implementation results in a memory array of inordinate size and cost for the benefits obtained.

Accordingly, there remains the need for an efficient architecture and circuitry by which memory array cell data can be extracted, logically combined with new data, and returned to the memory array cell in less time than the conventional read-modify-write sequence entails. Furthermore, the logical combinations of previously stored data and new data should be sufficiently diverse to permit routine use in high speed and high definition video display applications.

SUMMARY OF THE INVENTION

The invention, as presently embodied, involves a logical random access memory (LRAM) configured to logically combine, by cell or bit, new data with data already stored in a relatively conventional array of DRAM cells. In video display graphic systems, new pixel data (source data) is combined with the previously stored background pixel data (destination data) resident in DRAM to create and store in the same DRAM cell the resultant logical combination of pixel data. The LRAM undertakes the logical combination in a single memory access cycle. The integration of the read and write cycle into a single operation is accomplished through logic which interacts with the sense amplifier in the memory array upon addressing of the selected cell from within the DRAM array.

The source data is combined with Boolean logic mode select signals to generate during each addressing of a cell the control state signals FORCE 1, FORCE 0, COMP (complement) or NOOP (not changed). Additional logic immediately defines the effects of the control signals on the cell destination data, which data is then still resident in the sense amplifier and available for immediate logical combination.

The LRAM architecture increases the effective DRAM bandwidth without requiring a major redesign of the memory cells or array structure. The features of the invention are integrated into the sense amplifiers of the LRAM to reduce the component count. Though usable in static RAM implementations, the invention is particularly suited for DRAMs, whether of single or multiple port arrangement, and particularly where higher DRAM speed is needed to accomplish successive read-modify-write cycles.

The preferred architecture includes a mode register, for storing data representing the selected logical operation, and decode logic, for combining the mode signals with the source data in order to generate control signals for the sense amplifier. Logic in the sense amplifier addresses the destination data and in response to the control signals selects a new cell bit state to satisfy the mode requirement.

These and other beneficial and unique features of the present invention will be more fully understood and appreciated after considering the detailed description which follows.

BRIEF DESCRIPTION OF THE DRAWINGS

FIG. 3 is a schematic illustrating the decode of the control signals based upon the mode select and source data.

FIG. 4 is a LRAM circuit schematically illustrating one embodiment of the sense amplifier for a single bit line.

FIG. 5 is a schematic illustrating the general timing relationships of the memory array strobe and address signals.

DESCRIPTION OF THE PREFERRED EMBODIMENT

Figure 1:
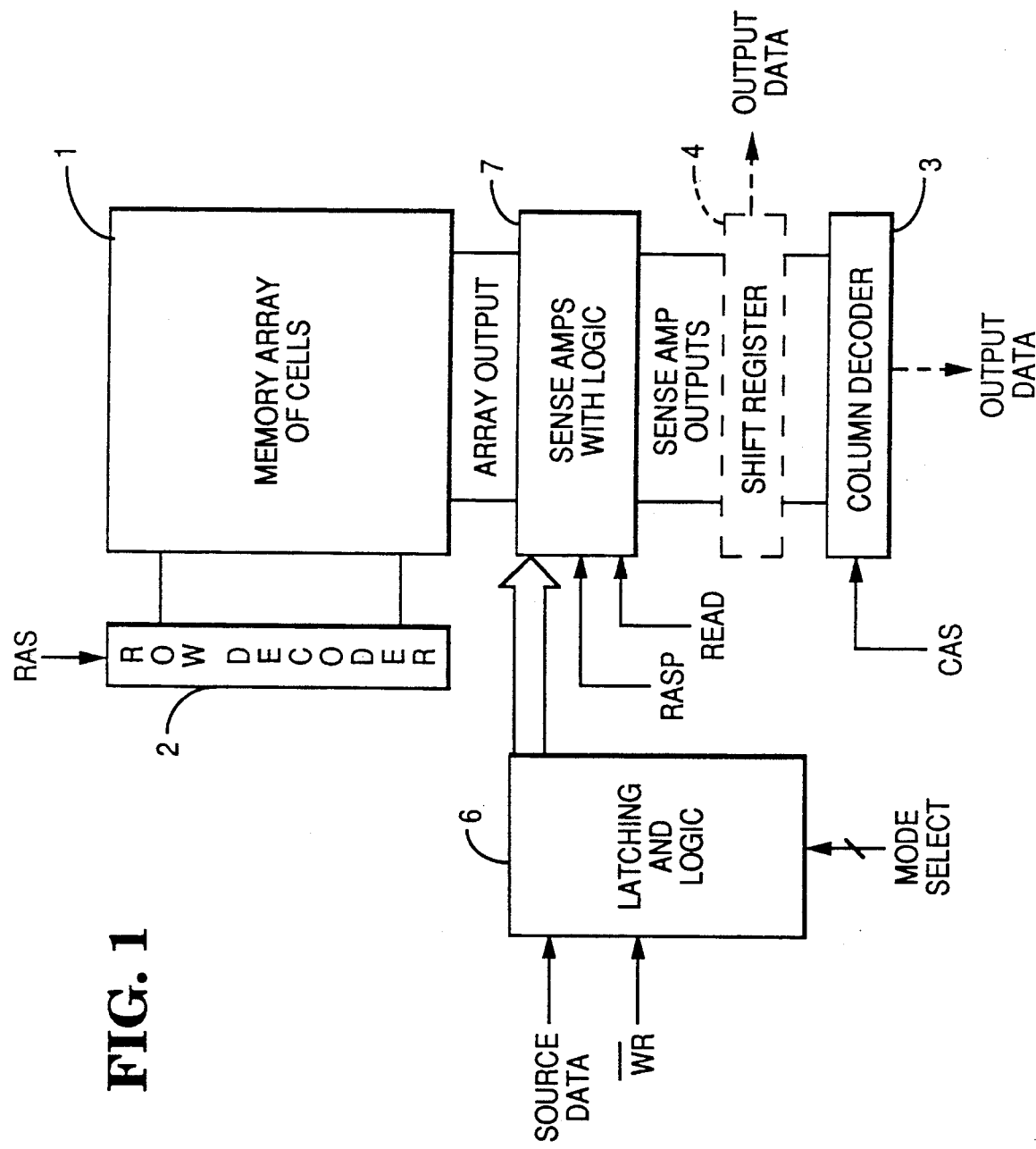
FIG. 1 is a schematic block diagram of the LRAM architecture.

The logical random access memory (LRAM) to which this invention pertains will be described in the context of a bit mapped video display system wherein the LRAM is used as the frame buffer. The use of the LRAM in contrast to a conventional RAM in such application increases the rate at which pattern changes can be inserted into the frame buffer and be made available for direct scanning and display. In a preferred arrangement, the LRAM logically combines source and destination data by pixel during a single memory access cycle. This is in contrast to conventional DRAM frame buffers which change frame buffer memory cell data using a read-modify-write operational sequence.

Contemporary bit mapped color video display systems use data words consisting of multiple bits to describe the color composition of each pixel position on the display screen. The number of bits used to represent each pixel is often referred to as the pixel depth. To display an image on the video screen, the display processor in the video system reads pixel word data from the frame buffer DRAM, logically converts the binary data words to values representing colors and attributes (such as blinking), and transmits such color information by pixel to the driver circuits in the video display.

The LRAM is most useful in graphics modes. In text modes, the existing data is simply written over (replace mode where D=S). In graphic interfaces such as Microsoft Windows, the logical operations AND and XOR are used frequently to display pixels patterns, such as icon based cursors.

Conventional graphics display adapters do not support frame buffer memory cycles which vary in length. For systems which do not support variable length memory cycles, the LRAM also provides a large performance improvement since only one access across the system bus is required. Such conventional display adapter architectures require two system bus transactions, which transactions are usually even longer than two random access cycles for the DRAMs in the frame buffer.

For systems which do support variable length memory cycles, the LRAM function decode methodology, the determination of the control functions FORCE 0, FORCE 1, NOOP, and COMP, provides a fast method for operating on data. The logical combination could be performed by the drawing processor, but even with variable length memory cycle capability this approach requires additional execution time and thus extends the read-modify-write time beyond the minimum duration.

The logic functions performed by the drawing processor upon the previously stored data are commonly described by referring to the previously stored DRAM data as the destination or background data. The new data, which is to be directly written into DRAM or logically combined with previously stored DRAM data, is commonly referred to as source or foreground data. Logical combinations of source and destination data by pixel are performed by the processor using graphics software routines. A representative logic operation is the XOR (exclusive OR) combination of source with destination data, made popular by its ability to return the displayed pixel data to its original state following the second application of the XOR function. Irrespective of the form, logic functions continue to require that the convention DRAM frame buffer data undergo a read-modify-write memory operational sequence in reaching the concluding state.

The value of the present logical random access memory (LRAM) circuit lies in its ability to perform a diverse logical operations in a single DRAM cell access operation. With the LRAM, the frame buffer will support faster changes while retaining the basic cell and array structure of the DRAM. As presently embodied the LRAM provides sixteen drawing modes, each corresponding to an individually defined logical combination of the source data with the destination data by pixel. See Table I. The new destination data as generated by the logical combination is retained in the DRAM at the conclusion of the single access cycle. Selection among the sixteen drawing modes (#0-15) which define the new destination data is by mode register lines R1-R4.

TABLE I

| Mode # | Logical Operation For New Destination | Register Lines | | | | Control Signal When | |
|---|---|---|---|---|---|---|---|
| | | R4 | R3 | R2 | R1 | S = 0 | S = 1 |
| 0 | D = 0 | 0 | 0 | 0 | 0 | FORCE 0 | FORCE 0 |
| 1 | D = D & S | 0 | 0 | 0 | 1 | FORCE 0 | NOOP |
| 2 | D = (Not D) & S | 0 | 0 | 1 | 0 | FORCE 0 | COMP |
| 3 | D = S | 0 | 0 | 1 | 1 | FORCE 0 | FORCE 1 |
| 4 | D = D & (Not S) | 0 | 1 | 0 | 0 | NOOP | FORCE 0 |
| 5 | D = D | 0 | 1 | 0 | 1 | NOOP | NOOP |
| 6 | D = D XOR S | 0 | 1 | 1 | 0 | NOOP | COMP |
| 7 | D = D or S | 0 | 1 | 1 | 1 | NOOP | FORCE 1 |
| 8 | D = Not (D or S) | 1 | 0 | 0 | 0 | COMP | FORCE 0 |
| 9 | D = Not (D XOR S) | 1 | 0 | 0 | 1 | COMP | NOOP |
| 10 | D = Not D | 1 | 0 | 1 | 0 | COMP | COMP |
| 11 | D = (Not D) or S | 1 | 0 | 1 | 1 | COMP | FORCE 1 |
| 12 | D = Not S | 1 | 1 | 0 | 0 | FORCE 1 | FORCE 0 |
| 13 | D = D or (Not S) | 1 | 1 | 0 | 1 | FORCE 1 | NOOP |
| 14 | D = Not (D & S) | 1 | 1 | 1 | 0 | FORCE 1 | COMP |
| 15 | D = 1 | 1 | 1 | 1 | 1 | FORCE 1 | FORCE 1 |

For the present embodiment, the control signals prescribed in the last two columns of Table I act directly upon the destination data in the LRAM to produce and store in a single access cycle new data embodying by cell the defined logical combination of source and destination data. In Table I, FORCE 0 means that the data bit stored in the DRAM memory cell following the access cycle is to be forced to a binary 0 state. Similarly, FORCE 1 means that the data bit is to be forced to a binary 1 state. The term NOOP is used to represent the lack of an operational change of the data previously resident in the memory cell being addressed. A COMP command indicates a complement operation, whereby the data previously in the addressed memory cell is inverted in the course of accomplishing the access cycle. Table I illustrates that relatively elaborate logic combinations of source and destination (S and D) data can be accomplished using the four control signals FORCE 0, FORCE 1, COMP and NOOP directly on the destination data resident in the cell at the start of the access cycle.

Another way to representing the operations defined in Table I is through a truth table. As shown in Table II the relationship between the source data and the destination data can be defined by a set of four register lines R1-R4. With respect to Tables I and II, also note that R4-R1 are the binary representations of the mode number 0-15.

TABLE II

| Source | Destination | Line Register |
|---|---|---|
| 0 | 0 | R4 |
| 0 | 1 | R3 |
| 1 | 0 | R2 |
| 1 | 1 | R1 |

Careful consideration of the information presented in Tables I and II will lead one to recognize that the destination data value does not need to be known explicitly to execute the logical combinations specified in Table I. For example, in mode #1, which is defined to have a new D value based upon a logical AND of D and S, a source bit of 0 will always result in a new destination value of 0. If, on the other hand, the source bit is 1, then the new destination value is identical to the original destination value. This is reflected in Table I under mode #1 by the FORCE 0 result specified when the source bit is 0 and the NOOP result specified when the source bit is 1 in value. Expanding from this example note that Table I defines a relatively extensive set of combinational logic which can be implemented within the framework of control signal operators (FORCE 0, FORCE 1, NOOP, COMP) responsive solely to the binary value of the source data. The final LRAM goal is to define a structure which performs such logic operations on the previously stored destination data to form the new destination data within a single memory access cycle.

The logical operations defined in Table I are integrated into a random access memory using the LRAM architecture depicted in FIG. 1 of the drawings. The basic memory array of the dynamic cells (DRAM array) 1, together with associated row decoder 2 and column decoder 3 are substantially identical to corresponding elements in conventional DRAMs. Shift register 4 facilitates serial data outputs often utilized in video display systems. The differences central to the present invention reside in latching and logic block 6 and sense amplifiers with logic block 7, which block 7 conventionally contains only sense amps.

The single memory access cycle logical combination and entry of data into the addressed cell in memory array 1 is accomplished through a rapid sequence of operations begun by entering source data and mode select data into latching and logic block 6. The logically, defined control signals generated in block 6 are then conveyed in conjunction with a slightly delayed version of write enable signal ($\overline{WR}$) to sense amplifiers with logic block 7. Such input signals logically interact with the destination data received from memory array 1 during detection by the sense amplifiers of block 7. At the conclusion of the memory access cycle the sense amplifier outputs and the correspondingly addressed memory cell data states are the logical conclusions of the combinations defined by the selected mode and source data.

Logical combination of source data with destination data can be undertaken in single bit format or in multiple bit word format, with the mode select being applied by bit or by word. The use of eight-bit wide words for source and destination data with associated eight-bit wide buses and eight-bit wide registers is now common in video display systems. In such context it is possible to be selective in the logical combinations of words by masking individual bits or groups of bits from the such multibit words in the course of the logical combination.

Those skilled in the art will no doubt appreciate that the concepts underlying the LRAM architecture depicted in FIG. 1 can also be used in conjunction with a memory arrays composed of other than dynamic cells. However, the higher density, lower relative access speed, and need for refresh makes the LRAM architecture and circuitry particularly suitable for dynamic memories. In this respect, the concurrent sensing and refresh of the data in the LRAM facilitates the single access cycle logical combination to which the invention pertains. All sense amps, except the one addressed by the column line select, refresh their respective bit lines.

The prevalence of conventional elements in the composite LRAM architecture of FIG. 1 suggests another beneficial aspect of the invention. The logic combination defined by control signal operators FORCE 0, FORCE 1, and NOOP can be implemented using relatively standard DRAM devices and sense amplifier circuits. Consequently, in an alternate embodiment, all logical combination modes except those identified by numbers 2, 6, 8–11 and 14 in Table I would be accomplished in a single memory access cycle using otherwise standard DRAMs and sense amplifier circuits. A multiple access read-modify-write cycle would be utilized when one of the above-listed COMP control signal related modes is selected.

The LRAM architecture depicted in the FIG. 1 is operated in relatively conventional manner during a read operation directed to the data store in memory array 1. Consequently, a read cycle involves the successive presentation of row and column address information to respective decoders 2 and 3 in corresponding synchronism with the row address strobe (RAS) and the column address strobe (CAS). It is the write operation which invokes the use of the logic elements which distinguish the operational speed of the LRAM from the conventional DRAM.

Figure 2:
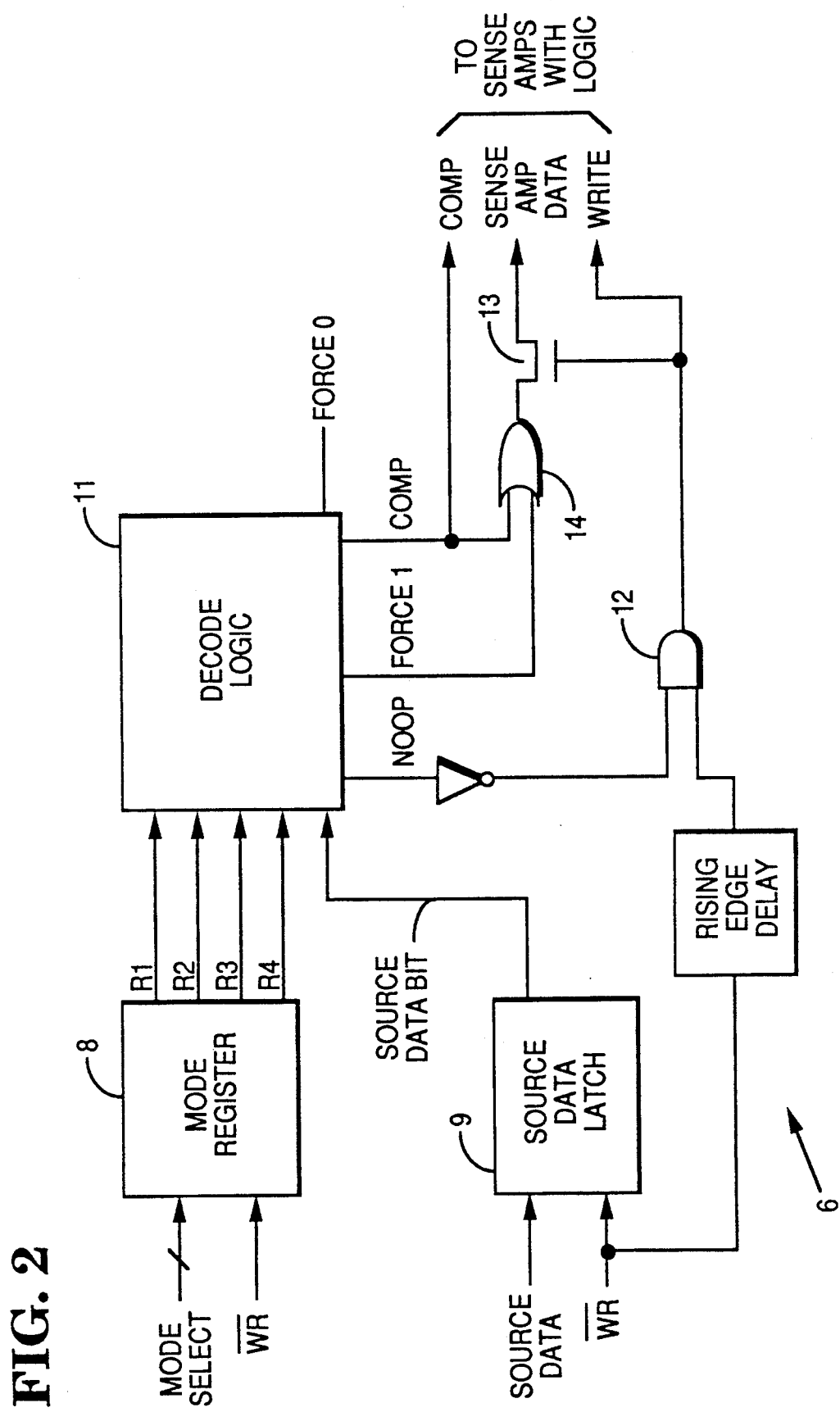
FIG. 2 is a schematic illustrating the relationship between the mode select data, the source data, and the control signals conveyed to the sense amplifier logic circuits.

Latching and logic block 6 of FIG. 1 is shown by detailed representation in FIG. 2 to include a multiple bit mode register 8 for latching the mode select data R1-R4. Source data latch block 9 holds the source data bit in response to a write signal based strobe WR/ and thereafter conveys the source data bit to decode logic block 11. Decoder logic block 11 logically combines the mode select data R1-R4 with the source bit data to define the states of the NOOP, FORCE 0, FORCE 1 and COMP signals as fully developed in Table 1. The NOOP signal is inverted and combined with a rising edge delayed write signal derivation in AND gate 12 to generate the WRITE signal convey to the sense amplifiers with logic block 7 (FIG. 1). The WRITE signal from AND gate 12 also selectively enables transistor 13 to press the output from OR gate 14, which OR gate combines the FORCE 1 and COMP signals. This gated output signal is identified as the SENSE AMP DATA conveyed to sense amplifiers with logic block 7. The COMP signal is also directly passed to the sense amplifiers with logic block 7.

The internal composition of decode logic block 11 in FIG. 2 is developed in FIG. 3. The configuration of AND gates 16-19 and 21-24, OR gates 26 and 27, and inverters 28, 29 and 31, as shown, coincide with the logic operations defined by the modes in Table 1 for the mode select lines R1-R4.

FIG. 4 illustrates a representative sense amplifier with logic for one bit line of the LRAM. For conventional multiple bit line memory array configurations, the sense amplifier and logic circuit depicted in FIG. 4 would be replicated in numerical correspondence to the number of bit lines.

Bit line data from memory array 1 (FIG. 1) enters the sense amplifier at node 36. The sense amplifier output is provided at node 37. The remaining signals are identifiable from the previous figures or are time delayed variations defined by the waveforms in FIG. 5. The reference voltage against which the voltage on SAMPLE NODE 39 is to be compared is identified as $V_{REFGEN}$. The magnitude of $V_{REFGEN}$ is typically halfway between the voltages seen on SAMPLE NODE 39 when logic 0 and logic 1 levels are transferred to node 39 from bit line 36.

The waveforms of signals uniquely suited to the embodiment depicted in FIGS. 1 and 4 are shown by plot in FIG. 5. The only signals meaningfully different from those routinely used in DRAM addressing are those identified as RASP and CASP. These signals are distinguished by virtue of short delays with respect to the RAS and CAS signals from which the two evolve, the delay intervals being suitable to allow row decoder block 2 to fully stabilize and provide array output data to sense amplifiers with logic block 7 (FIG. 1).

The function of the sense amplifier detailed in FIG. 4 is substantially the same as its function in a standard DRAM. As such, the sense amplifier during its read mode of operation detects the voltage level of the bit line to determine the binary state in the addressed memory array cell. Operationally, the bit line data on line 36 is conveyed through transistor M6 to SAMPLE NODE 39, and following sensing by the amplifier is passed through transistor M14 to SENSE AMP DATA line 38. Transistor 14 is driven by the READ signal.

Following sense amplifier design convention for a read operation, SAMPLE NODE 39 is pulled high or low in potential relative to the reference voltage level $V_{REFGEN}$ based upon the magnitude of charge stored in the DRAM memory cell addressed onto the bit line. The differential circuit transistors M1-M5 then compare the voltage level on SAMPLE NODE 39 to $V_{REFGEN}$, and following amplification in transistors M12-M13 define a sense amplifier output level on node 37 representing state in the addressed memory cell. The feedback loop including transistors M8 and M10, ensures that SAMPLE NODE 39 is pulled to the full value of the data state ($V_{DD}$ or ground) as a means of refreshing such state concurrent with a reading of its value. The sense amplifier output for each bit line is transmitted, as shown in FIG. 1, to shift register 4 for serial output or to column decoder 3 for further selection and output.

For operations which utilize the COMP function, the bit line voltage level is charge shared with the sample node through M6. The COMP/ signal is delayed (as is the WRITE signal) for a sufficient duration to allow charge sharing between bit line 36 and SAMPLE NODE 39 through transistor M6. M6 is turned off when the COMP/ signal becomes logic zero in value. The logic level on SAMPLE NODE 39 is determined by the sense amp, and the inverted value is driven onto bit line 36 by inverter 35 through transistor M17.

As embodied, the WRITE signal is directly responsive to the delayed rising edge of the WR/ signal described previously with reference to FIG. 2. This delay provides sufficient time before writing for the sense amplifier to determine the binary state of the bit line as appears on the sample node.

Operation of the LRAM in a write mode requires that the READ signal be made inactive, disabling transistor M14, and the WRITE signal become active to enable transistor M15. When COMP/ is active, SENSE AMP DATA line 38 is connected to drive SAMPLE NODE 39 to the level of the WRITE signal. Pull-down resistor 32 provide a discharge path for charge on SAMPLE NODE 39 when SENSE AMP DATA line 38 is low in potential but of high impedance. Since COMP/ and RASP/ are both active, transistor M6 is enabled to convey the WRITE state from SAMPLE NODE 39 to the bit line of the memory array.

When the logic operation defined by the mode select data on R1-R4 establishes in conjunction with the source data bit that the memory array bit line data state will have to be complemented as an element of the WRITE sequence, an active COMP disables transistor M16 to disconnect SENSE AMP DATA line 38 from SAMPLE NODE 39. The logical combination in AND gate 33 of the WRITE, COMP and sense amplifier data states provides through transistor M17 an inverted value of the sense amplifier output on line 37 generated by inverter 34. The AND condition of gate 33 is delayed in relation to the action of the WRITE signal on the SENSE AMP DATA. See FIG. 2. The presence of the RAS signal as an input to AND gate 34 disables transistor M6 to decouple bit line 36 from SAMPLE NODE 39 coincident with the enablement of transistor M17, thereafter conveying the inverted state to bit line 36 and the addressed memory cell. Thereby, the sense amplifier with logic circuit as embodied in FIG. 4 provides a selective capability to invert the data in the addressed memory array cell, which inversion is executed within the interval of a single memory access cycle.

The operation of the sense amplifier with logic depicted in FIG. 4 begins with the row address strobe signal (RAS) at an inactive level, commonly referred to as the RAS pre-charge time. During the interval when RAS is at a high state transistor M7 conducts to pre-charge SAMPLE NODE 39. Note in FIG. 5 that the RASP signal is similar in timing to the RAS signal, differing in that the RASP signal is delayed an interval comparable to the settlement time of the bit line. Following the transition of the RASP to a low state, data from bit line 36 is gated through transistor M6 onto the sense amplifier SAMPLE NODE 39 responsive to a logical AND combination of a RASP/ and a COMP/ signals on gate 34.

The sense amplifier transistors M1 and M3 are substantially identical to the transistors M2 and M4. The reference voltage $V_{REFGEN}$ is provided to the gate electrode of transistor M4, while the voltage on SAMPLE NODE 39 is provided to the gate electrode the differential complement transistor M3. For this arrangement, if the voltage on SAMPLE NODE 39 is greater than $V_{REFGEN}$, the drive signal to the gate electrode of transistor M12 will be less than the drive to the gate electrode of transistor M13, causing the voltage level of sense amplifier output node 37 to decrease. The feedback loop through transistors M10 and M8 to SAMPLE NODE 39 then drives SAMPLE NODE 39 to the positive supply rail $V_{DD}$. A low initial level of the bit line signal as conveyed to SAMPLE NODE 39 produces the opposite voltage extreme on SENSE AMP OUTPUT 37. This segment of the sense amplifier is in many respects similar to conventional DRAMS sense amplifiers.

In LRAM configurations which handle multiple line data, different logical operations (FORCE 1, FORCE 0, NOOP and COMP) will be performed on the bit lines of the different sense amplifier stages. For example, if mode #4 from Table I is defined to be operative, under which mode D=D & (not S), and the source registers receive both one and zero data values, then FORCE 0 control signal will define the logic operations in the sense amplifier where the source bit is a one and NOOP will be performed where the source bit is a zero. The NOOP simply refreshes the RAM cell. In this way, all bit lines accessed are either refreshed or written with new values.

Alternate arrangements of the LRAM architecture are also feasible with beneficial decreases in the transistor count but with expected losses in the operational speed. For example, the logic by which the COMP state is identified and implemented could be located in the row decoder in contrast to its present sense amplifier disposition. The focus of the invention would remain unchanged in that four control operators (FORCE 0, FORCE 1, NOOP and COMP) would be logically generated and used to implement logic combinations of source and destination data during a single memory access cycle.

The benefits of the LRAM are particularly important in color graphic video display systems where the combined effects of large pixel counts, extended color pallets and high drawing speeds require frame buffer DRAMS of exceptional speed. In the context of such display systems, it should also be recognize that the LRAM is not limited to single port memory array architecture, but includes multiple ports RAM configurations to provide an even further degree of elevated performance.

It will be understood by those skill in the art that the embodiments set forth hereinbefore are merely exemplary of the numerous arrangements by which the invention may be practiced, an as such may be replaced by equivalents without departing from the invention which will now be defined by appended claims.

What is claimed is:

1. A circuit for rapidly entering logic combinations of new and previously stored data into a random access memory, comprising:
   a random access memory having a row decoder for selecting an addressed row line from the array;
   sense amplifier responsive to data signals from the memory array bit lines;
   mode logic means for generating control signals as defined by selected logical combinations and new data signals; and
   means for altering the data in the sense amplifier during the addressing of a row line from the array in response to mode logic control signals
   wherein the sense amplifier and means for directly altering the data in the sense amplifier are situated between the random access memory array bit lines and a column decoder; and
   wherein the means for altering the data in the sense amplifier includes:
   means for producing a direct complement of the previously stored data selected during the addressing of a row line;
   means for sensing the binary state of the memory array bit lines; and
   means for selectively driving the binary state of the sensed memory array bit line states to a binary "0" or binary "1" as defined by the mode logic control signals.

2. The apparatus recited in claim 1, wherein the mode logic control signals for producing a direct complement of the previously stored data are based upon a logical combination of a bit line write signal, an inverted feedback of the previously stored data, and a complement control signal from the mode logic means.

3. A random access memory circuit having a sense amplifier with integrated logic, comprising:
   a random access memory array having a row decoder for selecting a row of bit lines from the array;
   a sense amplifier responsive to data signals from an array bit line and including a sample node selectively connectible to the bit line and to a forced state input line;
   means for holding data signals from the array bit line on the sample node while driving the bit line with a complement data signal; and
   mode logic means for generating control signals to define logical combinations of bit line data previously stored in the random access memory array with new data in the sense amplifier;
   wherein the operation defined by the mode logic means and implemented in the sense amplifier is accomplished within a single random access memory array write cycle time interval.

* * * * *